United States Patent
Saidan et al.

(10) Patent No.: US 7,023,363 B1
(45) Date of Patent: Apr. 4, 2006

(54) POSITION ENCODING USING IMPEDANCE COMPARISON

(76) Inventors: Saiful Bahari Saidan, P.O. Box 7599, Loveland, CO (US) 80537-0599; Seela Raj Rajaiah, P.O. Box 7599, Loveland, CO (US) 80537-0599

( * ) Notice: Subject to any disclaimer, the term of this patent is extended or adjusted under 35 U.S.C. 154(b) by 0 days.

(21) Appl. No.: 11/060,450

(22) Filed: Feb. 17, 2005

(51) Int. Cl.
*H03M 1/22* (2006.01)

(52) U.S. Cl. .............................. 341/11; 341/15; 341/10

(58) Field of Classification Search .................. 341/11, 341/15, 5
See application file for complete search history.

(56) References Cited

U.S. PATENT DOCUMENTS

| | | | |
|---|---|---|---|
| 5,241,172 A | | 8/1993 | Lugaresi |
| 5,519,393 A | * | 5/1996 | Brandestini ................... 341/11 |
| 5,650,779 A | * | 7/1997 | Sugden ......................... 341/11 |
| 5,774,074 A | * | 6/1998 | Cooper et al. ................. 341/11 |
| 6,297,750 B1 | * | 10/2001 | Wingate et al. ............... 341/11 |
| 6,600,151 B1 | | 7/2003 | Chapman et al. |
| 6,653,619 B1 | | 11/2003 | Chin et al. |
| 6,667,696 B1 | * | 12/2003 | Rodi ............................ 341/11 |
| 6,683,543 B1 | | 1/2004 | Yeo |
| 6,768,101 B1 | | 7/2004 | Lee et al. |
| 6,768,426 B1 | * | 7/2004 | Nekado et al. ................ 341/11 |
| 6,774,355 B1 | | 8/2004 | Kudo |
| 2004/0200957 A1 | | 10/2004 | Teng et al. |

* cited by examiner

*Primary Examiner*—John Nguyen
*Assistant Examiner*—Lam T. Mai

(57) ABSTRACT

An encoder system includes an encoding medium having a plurality of encoder target portions alternating with a plurality of encoder window portions. A sensor is movable in relation to the encoding medium. A signal source provides an electronic drive signal to the sensor and sensor electronics coupled to the sensor sense an electrical characteristic of the code strip to determine whether the sensor is next to an encoder target portion or is next to an encoder window portion.

16 Claims, 3 Drawing Sheets

POSITION ENCODING USING IMPEDANCE COMPARISON

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Optical encoding techniques are used to indicate the position and other attributes of an object, such as an ink-jet print head used in an ink-jet printer, a thermal print head, a rotary shaft, or a paper feeder. Examples of attributes include linear position of the object, the rotational position of the object, and the speed of the object. Conventional printers often use an optical encoder system with and optical encoder medium.

A typical optical encoder system has an emitter section that directs light toward a detector section that includes one or more photodiodes, signal processing circuitry, and other circuitry. In some cases, the light from a light-emitting diode in the emitter section is collimated into a parallel beam by a lens. Conventional optical encoder media, such as optical code wheels or optical code strips has a pattern of transparent and opaque sections, also known as spaces and bars. As the emitter/detector section moves relative to the optical encoder medium, the light beam is interrupted by the code strip or code wheel. The detector section transforms the interrupted light into electrical signals that indicate the position of the emitter/detector section.

Unfortunately, an optical encoder system can fail if it becomes contaminated, such as with ink mist or dust from paper or the environment. Such contamination can scratch the lens and/or optical encoder medium (e.g. optical code strip), which can cause a catastrophic failure of the optical encoder system. A number of solutions have been proposed to avoid such failures in optical encoders, including: higher sensitivity photo detectors, more photo detectors, increased light output, different light wavelengths, and adding contamination shields and filters. However, optical encoder systems remain vulnerable to contamination and damage from contamination. Therefore, encoder systems avoiding the above-mentioned problems are desired.

BRIEF SUMMARY OF THE INVENTION

An encoder system includes an encoding medium having a plurality of encoder target portions alternating with a plurality of encoder window portions. A sensor is movable in relation to the encoding medium. A signal source provides an electronic drive signal to the sensor and sensor electronics coupled to the sensor sense an electrical characteristic of the code strip to determine whether the sensor is next to an encoder target portion or is next to an encoder window portion.

DETAILED DESCRIPTION OF THE EMBODIMENTS

Figure 1A:
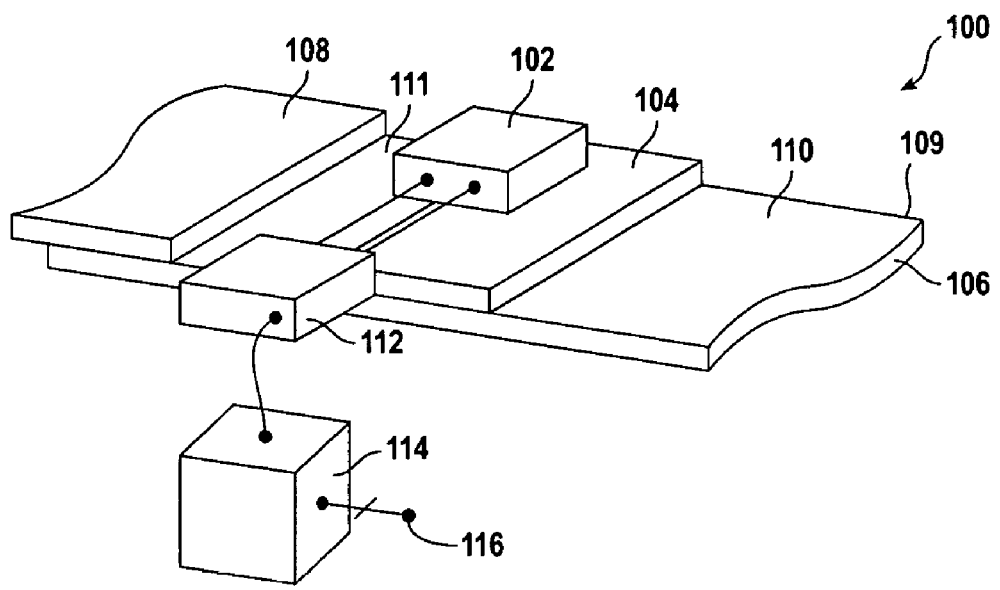
FIG. 1A shows an isometric view of an encoder system according to an embodiment of the invention.

FIG. 1A shows an isometric view of an encoder system 100 according to an embodiment of the invention. A sensor 102 produces electromagnetic fields in an encoder target portion ("encoder target") 104 of an encoder medium, such as a segment of a coding wheel or code strip. The encoder target portion 104 is a layer of material formed on a substrate 106 that causes a change in the apparent impedance of the sensor 102 to occur when the sensor 102 is next to the encoder target portion 104. In other words, the sensor senses an electrical characteristic of the code strip to determine whether the sensor is next to an encoder target portion. In some embodiments, the encoder target is made of an essentially non-magnetic metal, such as aluminum, copper, stainless steel or brass. Alternatively, the encoder target is made of a magnetic metal, such as nickel, iron, or cobalt; or magnetic, non-conductive material. The substrate can be a metal strip of the same material as the target, a metal strip of a different material than the target, or a plastic strip, such as a polyester film (e.g. MAYLAR®) or a polyimide film (e.g. KAPTON®). In a particular embodiment, a series of periodic encoder target portions 104, 108 alternate in a regular, periodic fashion with encoder window portions 110, 111 of the code strip 109.

The sensor 102 has a coil that, when energized using a alternating electronic drive signal, such as a sinusoidal, sawtooth, triangular, or square-wave electronic drive signal, induces an electromagnetic field in the encoder target portion 104. In a conductive, non-magnetic encoder target, the electromagnetic field arises from induced eddy currents. In a magnetic, non-conductive encoder target, the electromagnetic field arises from magnetic domain orientation. In conductive, magnetic encoder targets, the electromagnetic field arises from both eddy currents and magnetic domain orientation.

In some embodiments, a single coil is used to both induce the electromagnetic field and to sense the encoder target. Alternatively, two or more coils are used in differential coil techniques. Differential coil techniques are particularly good for detecting closely spaced encoder targets and for providing an indication of direction of travel in some embodiments. A coil(s) with its axis of induction perpendicular to the surface of the encoder target portion 104 is used in some embodiments.

Many factors affect electromagnetic response in the encoder target portion 104, such as conductivity of the target, permeability of the target, test (i.e. drive) frequency, number of coil windings, current through the coil, thickness of the target (in some cases), and proximity of the coil to the surface of the encoder target portion 104. For example, eddy currents are induced in a conductive target. The depth to which eddy currents are induced in the encoder target generally decreases with an increase in frequency, an increase in conductivity, and an increase in permeability. These factors are easily characterized and calibrated out in an encoder system, which then generally looks for a change between the encoder targets portions 104, 108, and encoder window portions 110, 111.

Another type of electromagnetic response that can be induced in a target is a magnetization moment, which is frequently modeled as a circular current around a magnetization vector. Code strips made with magnetic conductors (e.g. metals with relatively high permeability, μ ("mu"), such as iron, nickel, and cobalt, can create both magnetization and eddy currents and offer high differentiation between encoder target portions and encoder window portions. As used herein, "high permeability" means an initial permeability 200 times or greater than the permeability of free space. Many alloys also have a high permeability and are suitable for encoder targets.

Sensor electronics 112 provide an alternating electronic drive signal to the sensor 102. The sensor electronics 112 also measure an electrical characteristic, such as inductance or other impedance, of the sensor 102. In a particular embodiment, the sensor electronics provide the alternating electronic drive signal at a selected frequency to the sensor and measures the impedance of the sensor. Impedance terms include inductance, resistance, and capacitance. Some impedance terms are calibrated out or may be simply ignored in some embodiments. In a particular example, an initial impedance reading is taken when the sensor is over an encoder window portion and compared to an impedance reading of the sensor when it is over an encoder target portion. Impedance meters, inductance meters, and related techniques are well known in the art and a detailed description of the sensor electronics is omitted.

A signal processor 114 counts the number of changes in impedance, which corresponds to the number of encoder targets and encoder windows the sensor 102 has passed, and converts the data from the sensor electronics 112 into a digital output 116. The digital output 116 is used to determine the motion and/or position of the sensor 102 with respect to the code strip 109. In a particular embodiment the sensor moves in a step-wise fashion and is aligned and indexed to the code strip so that the sensor is proximate to either an encoder target portion or an encoder window portion at each step. Thus, the sensor alternatively senses the impedance of an encoder target portion and then the impedance of an encoder window portion as the sensor moves relative to the encoder medium. In particular embodiments, the change in inductance is the major component of the impedance that is sensed.

In one embodiment, the encoder targets all have the same width, and all the encoder windows have the same width as the encoder targets. The sensor moves relative to the code strip in increments in a step-wise fashion in steps equal to the width of the targets/windows. In an alternative embodiment, the sensor measures impedance values transitioning between an encoder target and an encoder window.

Figure 1B:
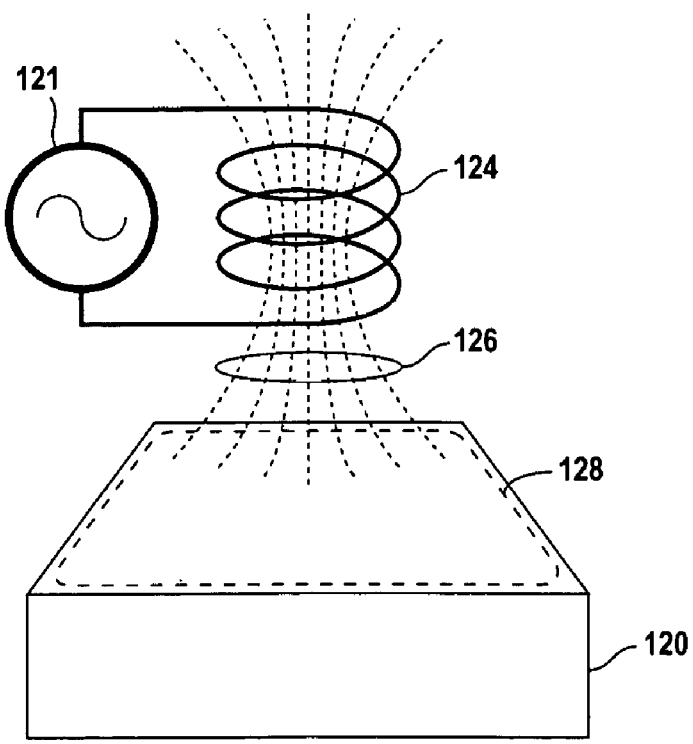
FIG. 1B is diagram representing the sensor of the encoder system of FIG. 1A over an encoder target.

FIG. 1B is a diagram representing the sensor of the encoder system of FIG. 1A over a conductive encoder target 120. A signal source 121 drives alternating current through a coil 124. The coil 124 is a cylindrical or "pencil-type" coil, but alternatively is a planar-wound coil, which is commonly referred to as a "pancake" coil. The current through the coil 124 generates a primary magnetic field, represented by dashed lines 126. The magnetic field strength increases as the current through the coil 124 increases. The changing magnetic field strength induces eddy currents in the conductive encoder target 120. These eddy currents generate a secondary magnetic field. The flux field lines of the secondary magnetic field are familiar to those of skill in the art, and are not shown for simplicity and clarity of illustration. The eddy currents induced in the conductive encoder target 120 resist changes in the current flowing through the coil 124. This has the affect of increasing the apparent inductance of the coil.

Figure 1C:
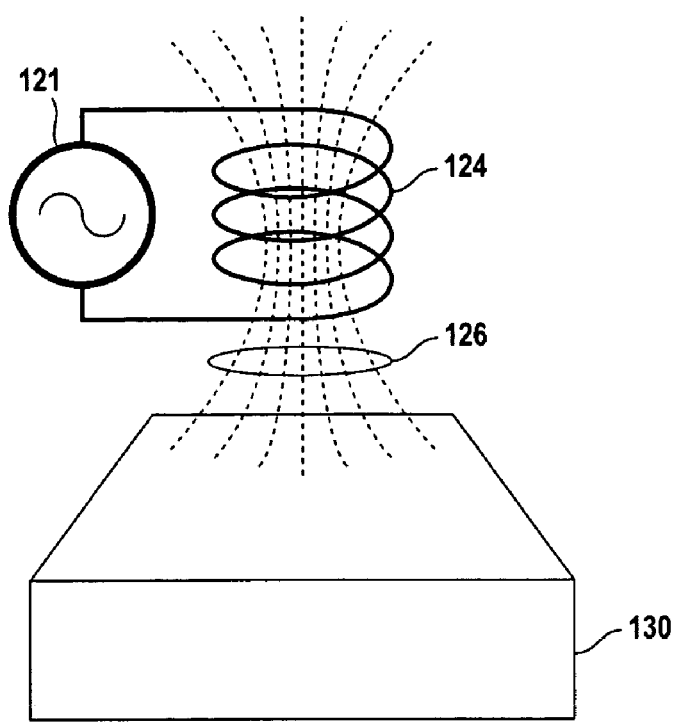
FIG. 1C is a diagram representing of the sensor of the encoder system of FIG. 1A over an encoder window.

FIG. 1C is a diagram of the sensor of the encoder system of FIG. 1A over a non-conductive, non-magnetic encoder window 130. The signal source 121 drives alternating current through the coil 124. The current through the coil 124 generates a primary magnetic field, represented by dashed lines 126. The magnetic field strength increases as the current through the coil 124 increases. However, since the encoder window 130 is non-magnetic and non-conductive, the apparent inductance of the coil 124 is essentially the same as its free-space inductance. Some change in apparent inductance over the free-space inductance may arise due to the proximity of conductive and/or magnetic encoder targets on either side of an encoder window.

Alternatively, an encoder window is conductive and/or magnetic, but produces a sufficiently different change in the impedance of the sensor to distinguish between encoder target and encoder window portions of a code strip or code wheel. For example, a code strip is made of a metal, but the encoder portions are thicker and closer to the sensor than the encoder window portions. Alternatively, a code strip substrate is made of a first metal, and the encoder target portions of the code strip have a layer of a second metal, which has higher conductivity and/or higher permeability than the first metal. In a further embodiment, the thickness of the layer of second metal brings the encoder target closer to the sensor, further facilitating differentiation between the encoder target portions and the encoder window portions.

Figure 1D:
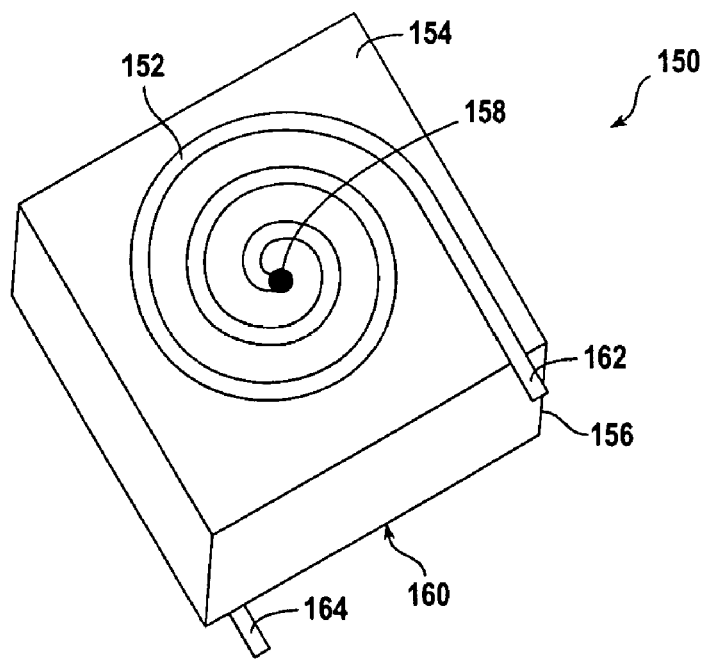
FIG. 1D is an isometric view of a coil device according to an embodiment of the present invention.

FIG. 1D is an isometric view of a coil device 150 according to an embodiment of the present invention. The coil device 150 has a coil 152 formed on a surface 154 of a substrate 156. The substrate is a printed circuit board ("PCB") substrate and the coil 150 is defined using printed circuit board techniques. Alternatively, the substrate is a silicon chip, thin-film substrate, thick-film substrate, flexible substrate ("flexstrate"), or other substrate. In an alternative embodiment, the substrate is a thin-film substrate, such as a ceramic or sapphire substrate, and the coil is defined using thin-film techniques. In yet another embodiment, the substrate is a portion of a silicon wafer, commonly referred to as a silicon "chip", and the coil is defined using semiconductor manufacturing techniques. In yet other embodiments, the coil is a loop or an out-of-plane coil.

The coil 152 is formed from a metal foil layer, such as a copper foil layer, that is optionally tinned or plated. A conductive via 158 electrically couples the coil 152 to a terminal 164 on a backside 160 of the substrate 156. Current flows through the coil 152 when an electrical signal is coupled to the terminals 162, 164 of the coil 152. Alternatively, the terminal 164 is omitted and the backside of the substrate is mounted on a conductive support member (not shown) so as to provide a current path to the conductive via, and hence through the coil 152 to the terminal 162.

In a particular embodiment, the encoder target portions alternate with the encoder window portions in a regular, periodic fashion. The ability to distinguish between encoder targets and encoder windows depends in part on the sensitivity of the sensor electronics, but is more likely dominated by the quality factor ("Q-factor") of the coil, the drive frequency, the physical size of the coil, and the proximity of the coil to the encoder target.

It is generally desirable to situate the coil as near to the encoder target as possible to maximize the difference in impedance of the sensor between encoder target portions and encoder window portions of an encoder medium. The impedance of an inductor (also called inductive reactance) is $2\pi$ times the frequency (e.g. 80 kHz) times the inductance, L, which is typically shortened to $\omega L$. Referring to FIGS. 1B and 1C, the encoder target increases the apparent inductance, $L_A$, of the coil. When the coil is next to an encoder window, its apparent inductance is closer to its free-space, or nominal, inductance, $L_0$. Thus, the apparent inductance of the coil changes from a first value to a second value as the sensor moves relative to a code strip or code wheel.

Figure 2:
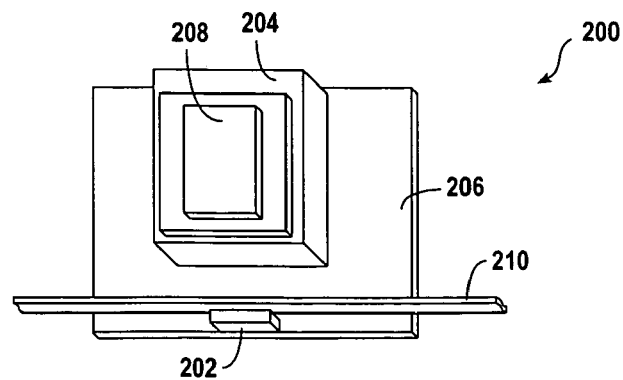
FIG. 2 shows an isometric view of an encoder system in an application according to an embodiment of the invention.

FIG. 2 shows an isometric view of an encoder system 200 according to an embodiment of the invention. A sensor 202 and an ink cartridge 204 are mounted on a substrate 206. The ink cartridge 204 includes a print head 208. The encoder system 200 is used in a printer (not shown), such as an ink jet printer or a thermal printer. An encoder strip 210 is fixed in the printer and the sensor 202 moves along the encoder strip 210 with the print head 208 as it moves across paper (not shown) or other media in the printer. The impedance of the sensor changes as it moves across the sensor, and the combination of the sensor and code strip works as an incremental encoder to accurately position the print head 208 relative to the paper in the printer. Alternatively, the print head and sensor are fixed, and the paper or other print media moves in conjunction with the encoder strip.

Figure 3:
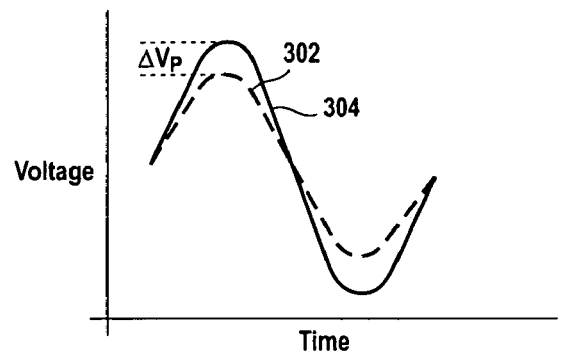
FIG. 3 shows plots of electrical outputs of the sensor as it moves relative to the code strip of FIG. 2.

FIG. 3 shows plots of electrical outputs of the sensor as it moves relative to the code strip of FIG. 2. A signal source (see FIG. 2B, ref. num. 121) provides a sinusoidal signal to the sensor. A first plot 302 shows the voltage output by the sensor when it is next to an encoder window and driven by the sinusoidal signal. A second plot 304 shows the voltage output by the sensor when it is next to an encoder target and driven by the sinusoidal signal. The apparent impedance of the sensor is greater when it is next to the encoder target, thus supporting a higher voltage. It is generally desirable that the difference between peak voltages, $\Delta V_P$, be sufficiently great to reliably distinguish between encoder targets and encoder windows of a code strip or code wheel.

Figure 4A:
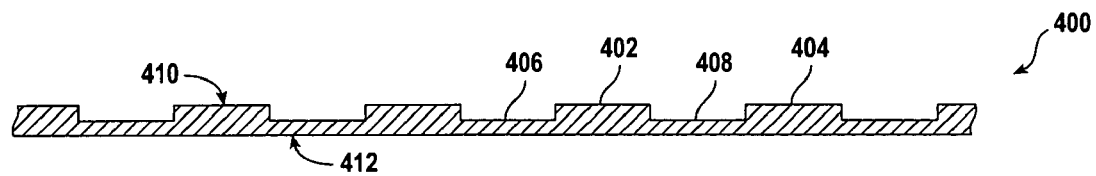
FIG. 4A is a side view of a code strip according to an embodiment of the invention.

FIG. 4A is a side view of a code strip 400 according to an embodiment of the invention. The code strip 400 is made of a conductive metal, such as brass or copper, and has encoder target portions 402, 404 that are thicker than alternating encoder window portions 406, 408. In a particular embodiment, a sensor is next to a first side 410 of the code strip. When moved in relation to a sensor in an encoder system, the encoder target portions are closer to the sensor and also provide less resistance to forming eddy currents. Thus, the effect of eddy currents is greater in the encoder target portions than in the encoder window portions. Alternatively, the sensor is next to a second side 412 of the code strip. The distance from the sensor to the encoder window portions is the same as from the sensor to the encoder target portions; however, the thicker encoder target portions more easily form eddy currents than do the thinner encoder window portions, thus allowing the sensor to distinguish between them.

Figure 4B:
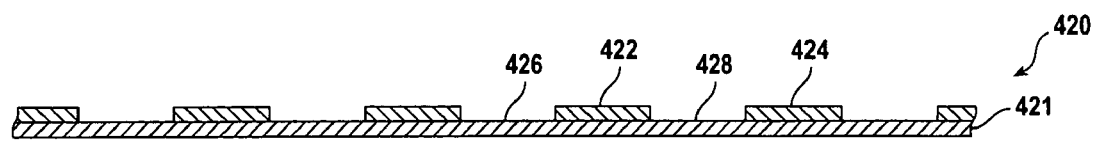
FIG. 4B is a side view of a code strip according to another embodiment of the invention.

FIG. 4B is a side view of a code strip 420 according to another embodiment of the invention. The code strip includes a substrate 421 of a first material and encoder target portions 422, 424 of a second material, typically a conductive material, a magnetic conductive material, or a magnetic non-conductive material. In a particular embodiment the substrate is a metal. In an alternative embodiment the substrate is a flexible polymer film, such as a polyester film or a polyimide film. A flexible polymer film or metal substrate can be held in tension in a printer to provide a straight code strip. In yet another embodiment, the substrate is a rigid substrate, such as a PCB substrate. The encoder target portions 422, 424 alternate with encoder window portions 426, 428 of the code strip 420.

Figure 4C:
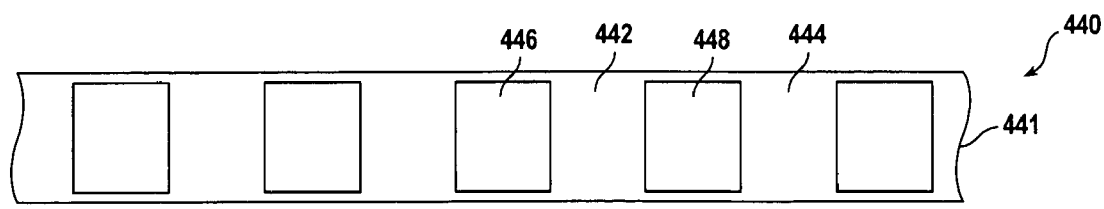
FIG. 4C is a plan view of a code strip according to yet another embodiment of the invention.

FIG. 4C is a plan view of a code strip 440 according to yet another embodiment of the invention. The code strip 440 is made from a strip 441 of conductive material, such as brass, copper, aluminum, stainless steel, plain steel, iron or alloy. Solid areas of the strip form encoder target portions 442, 444 that alternate with cut-out areas that form encoder window portions 446, 448.

A sensor indexed to be next to either an encoder target or an encoder window on a code strip, such as one of the examples illustrated in FIGS. 4A–4C, provides an electrical output that indicates whether it is next to an encoder target or an encoder window. In a particular embodiment, the sensor is driven by a periodic, varying signal source to induce eddy currents and/or a secondary magnetic field in the encoder target. In a further embodiment, outputs from the sensor are processed to determine the position of the sensor along the code strip.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. An encoder system comprising:
   an encoding medium having a plurality of encoder target portions alternating with a plurality of encoder window portions;
   a sensor movable in relation to the encoder medium;
   a signal source providing an electronic drive signal to the sensor; and
   sensor electronics coupled to the sensor so as to sense an electrical characteristic of the code strip to determine whether the sensor is next to an encoder target portion or is next to an encoder window portion.

2. The encoder system of claim 1 wherein the sensor includes a coil.

3. The encoder system of claim 2 wherein the sensor comprises a planar coil.

4. The encoder system of claim 2 wherein the sensor comprises a cylindrical coil.

5. The encoder system of claim 1 wherein the encoder medium is a code strip.

6. The encoder system of claim 1 wherein the encoder medium is a coding wheel.

7. The encoder system of claim 1 wherein the plurality of encoder target portions alternates with the plurality of encoder portions in a regular, periodic fashion.

8. The encoder system of claim 1 wherein the sensor measures a first impedance when the sensor is next to the encoder target portion and measures a second impedance when the sensor is next to the encoder window portion.

9. The encoder system of claim 1 wherein the sensor is indexed to move in an incremental fashion relative to the code strip.

10. The encoder system of claim 1 wherein the plurality of encoder target portions comprises conductive, non-magnetic material.

11. The encoder system of claim 1 wherein the plurality of encoder target portions comprises conductive magnetic material.

12. The encoder system of claim 1 wherein the plurality of encoder window portions comprises conductive material.

13. The encoder system of claim 1 wherein the plurality of encoder window portions are non-conductive.

14. The encoder system of claim 1 wherein the electronic drive signal is a periodic alternating signal.

15. The encoder system of claim 14 wherein the electronic drive signal is a sinusoidal signal.

16. The encoder system of claim 1 further comprising
an print head; and
a substrate, wherein the sensor and the print head are mounted on the substrate so that the print head moves with the sensor relative to the code strip.

* * * * *